US008239787B2

(12) United States Patent
Yamazoe

(10) Patent No.: US 8,239,787 B2
(45) Date of Patent: Aug. 7, 2012

(54) METHOD OF GENERATING ORIGINAL PLATE DATA BY REPEATEDLY CALCULATING APPROXIMATE AERIAL IMAGE

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 942 days.

(21) Appl. No.: 12/173,525

(22) Filed: Jul. 15, 2008

(65) Prior Publication Data
US 2009/0027650 A1  Jan. 29, 2009

(30) Foreign Application Priority Data

Jul. 24, 2007  (JP) .................... 2007-191939

(51) Int. Cl.
G06F 17/50 (2006.01)
G03B 27/00 (2006.01)
G03F 1/00 (2012.01)

(52) U.S. Cl. ............ 716/54; 716/50; 716/51; 716/55; 355/18; 355/67; 355/77; 430/5

(58) Field of Classification Search ............ None
See application file for complete search history.

(56) References Cited

U.S. PATENT DOCUMENTS

| | | | | |
|---|---|---|---|---|
| 6,738,859 B2 * | 5/2004 | Liebchen | ............... | 716/51 |
| 7,088,419 B2 * | 8/2006 | Dowski et al. | ............... | 355/18 |
| 7,231,629 B2 * | 6/2007 | Laidig | ............... | 716/51 |
| 7,310,796 B2 * | 12/2007 | Schwarzband | ............... | 382/144 |
| 7,506,299 B2 * | 3/2009 | Socha et al. | ............... | 716/132 |
| 2003/0140330 A1 | 7/2003 | Tanaka et al. | | |
| 2004/0229133 A1 | 11/2004 | Socha | | |
| 2005/0142470 A1 | 6/2005 | Socha | | |
| 2005/0179886 A1 | 8/2005 | Shi | | |
| 2009/0027650 A1 * | 1/2009 | Yamazoe | ............... | 355/77 |

FOREIGN PATENT DOCUMENTS

CN  1424743 A  6/2003

(Continued)

OTHER PUBLICATIONS

Cobb N et al: "Mathematical and Cad Framework for Proximity Correction" Proceedings of the Spie—The International Society for Optical Engineering, Spie, Bellingham, VA; US, vol. 2726, Mar. 13, 1996, pp. 208-222, XP008022569.

*Primary Examiner* — Leigh Garbowski
*Assistant Examiner* — A. M. Thompson
(74) *Attorney, Agent, or Firm* — Canon USA Inc. IP Division

(57) ABSTRACT

Method for generating data for an original plate used during processing for illuminating the original plate and projecting an image of a pattern onto the original plate onto a substrate via a projection optical system. A two-dimensional transmission cross coefficient is calculated based on a function indicating a distribution of an intensity of light formed on a pupil plane of the projection optical system. An approximate aerial image is calculated based on the calculated two-dimensional transmission cross coefficient and a first pattern on an object plane of the projection optical system. A second pattern is generated having the first pattern on the object place and auxiliary patterns based on the approximate aerial image. The original plate data is generated by repeatedly calculating the approximate aerial image and generating a second pattern that is used as the first pattern on the object plane.

5 Claims, 9 Drawing Sheets

FOREIGN PATENT DOCUMENTS

| | | |
|---|---|---|
| EP | 1439420 A1 | 7/2004 |
| EP | 1494070 A2 | 1/2005 |
| EP | 1513012 A2 | 3/2005 |
| EP | 1528429 A2 | 5/2005 |
| EP | 1544680 A2 | 6/2005 |
| JP | 2004-221594 A | 8/2004 |
| JP | 2004-272228 A | 9/2004 |
| JP | 2005-122163 A | 5/2005 |
| JP | 2005-183981 A | 7/2005 |

\* cited by examiner

METHOD OF GENERATING ORIGINAL PLATE DATA BY REPEATEDLY CALCULATING APPROXIMATE AERIAL IMAGE

BACKGROUND OF THE INVENTION

1. Field of the Invention

The present invention generally relates to an original plate data generation method, an original plate generation method, an exposure method, a device manufacturing method and a computer-readable storage medium for generating original plate data.

2. Description of the Related Art

An exposure apparatus is used in a photolithographic process for manufacturing a semiconductor device such as an integrated circuit (IC). An exposure apparatus illuminates an original plate (also referred to as a "mask" or a "reticle") and exposes a circuit pattern drawn on the original plate onto a substrate (a wafer) via a projection optical system.

It is desired that a semiconductor device manufacturing process is simplified, and the capacity of an exposure apparatus is improved.

In an exposure apparatus, a resolution which indicates how minute a pattern can be formed on the substrate and a throughput which is indicated by a number of substrates that can be completely exposure-processed in a unit of time are used as indexes for the capacity of the exposure apparatus. As a method for improving the throughput of an exposure apparatus, conventional methods increase a driving speed of a stage that supports a substrate or increase an amount of light intensity on a surface of a substrate.

Meanwhile, as a method for improving the resolution of an exposure apparatus, conventional methods increase a numerical aperture (NA) in a projection optical system, reduce an exposure wavelength λ, or decrease a k1 factor. Furthermore, another conventional method improves the resolution of an exposure apparatus by modifying a pattern of an original plate and using various pattern arrangements.

A representative conventional method inserts an auxiliary pattern having a size with which the auxiliary pattern is not resolved, into an original plate on which a contact hole pattern to be transferred is drawn. This method is one of the conventional methods for decreasing the k1 factor.

Japanese Patent Application Laid-Open No. 2004-221594 discusses a method for deriving how an auxiliary pattern is inserted by a numerical calculation.

The method discussed in Japanese Patent Application Laid-Open No. 2004-221594 obtains a distribution of an approximate image plane intensity (amplitude) by a numerical calculation to derive an interference map indicating the distribution of the approximate image plane intensity (amplitude). The method discussed in Japanese Patent Application Laid-Open No. 2004-221594 arranges an auxiliary pattern around a pattern to be transferred using the interference map.

While Japanese Patent Application Laid-Open No. 2004-221594 discusses an auxiliary pattern arrangement method for improving a depth of focus and an auxiliary pattern arrangement method for improving an exposure likelihood, a method for improving the throughput of an exposure apparatus is not discussed.

SUMMARY OF THE INVENTION

The present invention is directed to a method for generating original plate data adapted to improve a resolution and a throughput of an exposure apparatus.

According to an aspect of the present invention, a method for generating data for an original plate used during processing for illuminating the original plate with illumination light and projecting an image of a pattern on the original plate onto a substrate via a projection optical system. The method includes calculating a two-dimensional transmission cross coefficient based on a function indicating a distribution of an intensity of light formed on a pupil plane of the projection optical system with the illumination light and a pupil function for the projection optical system, calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system, generating a further pattern having the first pattern on the object plane and auxiliary patterns based on the approximate aerial image, and generating original plate data including a pattern generated by repeatedly performing the calculating processing and the generating processing by using the further pattern generated by the generating processing as the first pattern on the object plane. According to another aspect of the present invention, a computer-readable storage medium is provided containing computer-executable instructions for generating data for an original plate used during processing for illuminating the original plate with illumination light and projecting an image of a pattern on the original plate onto a substrate via a projection optical system. The medium includes computer-executable instructions for calculating a two-dimensional transmission cross coefficient based on a function indicating a distribution of an intensity of light formed on a pupil plane of the projection optical system with the illumination light and a pupil function for the projection optical system; computer-executable instructions for calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system; computer-executable instructions for generating a further pattern having the first pattern on the object plane and auxiliary patterns based on the approximate aerial image; and computer-executable instructions for generating original plate data including a pattern generated by repeatedly performing the calculating processing and the generating processing by using the further pattern generated by the generating processing as the first pattern on the object plane.

According to another aspect of the present invention, a method for generating data for an original plate used during processing for illuminating the original plate with illumination light and projecting an image of a pattern on the original plate onto a substrate via a projection optical system. The method includes calculating a transmission cross coefficient based on a function indicating a distribution of an intensity of light formed on a pupil plane of the projection optical system with the illumination light and a pupil function for the projection optical system, calculating an interference map based on an eigen value and an eigen function for the calculated transmission cross coefficient and a first pattern on an object plane of the projection optical system, generating a further pattern having the first pattern on the object plane and auxiliary patterns based on the interference map, and generating original plate data including a pattern generated by repeatedly performing the calculating processing and the generating processing by using the further pattern generated by the generating processing as the first pattern on the object plane.

According to another aspect of the present invention, a computer-readable storage medium is provided containing computer-executable instructions for generating data for an original plate used during processing for illuminating the original plate with illumination light and projecting an image of a pattern on the original plate onto a substrate via a projection optical system. The medium includes computer-executable instructions for calculating a transmission cross coefficient based on a function indicating a distribution of an intensity of light formed on a pupil plane of the projection optical system with the illumination light and a pupil function for the projection optical system; computer-executable instructions for calculating an interference map based on an eigen value and an eigen function for the calculated transmission cross coefficient and a first pattern on an object plane of the projection optical system; computer-executable instructions for generating a further pattern having the first pattern on the object plane and auxiliary patterns based on the interference map; and computer-executable instructions for generating original plate data including a pattern generated by repeatedly performing the calculating processing and the generating processing by using the further pattern generated by the generating processing as the first pattern on the object plane.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the present invention.

DETAILED DESCRIPTION OF THE EMBODIMENTS

Various exemplary embodiments, features, and aspects of the present invention will now be described in detail with reference to the drawings. The relative arrangement of the components, the numerical expressions, and numerical values set forth in these embodiments are not intended to limit the scope of the present invention, unless explicitly stated.

The conception according to an exemplary embodiment of the present invention can be expressed as hardware or put into a mathematical model. Accordingly, an exemplary embodiment of the present invention can be installed in a computer system as a program.

The software function of the computer system according to the present exemplary embodiment includes a program having computer-executable program codes and can determine a pattern of a mask which is an original plate and generate original plate data. The software codes can be stored on at least a storage medium such as a machine-readable medium or a memory, as one or more modules. The exemplary embodiment of the present invention, which will be described below, can be described in the form of program codes and can function as one or more software products.

An exemplary configuration of a computer that executes an original plate data generation program according to the present exemplary embodiment will be described below with reference to FIG. 1.

Figure 1:
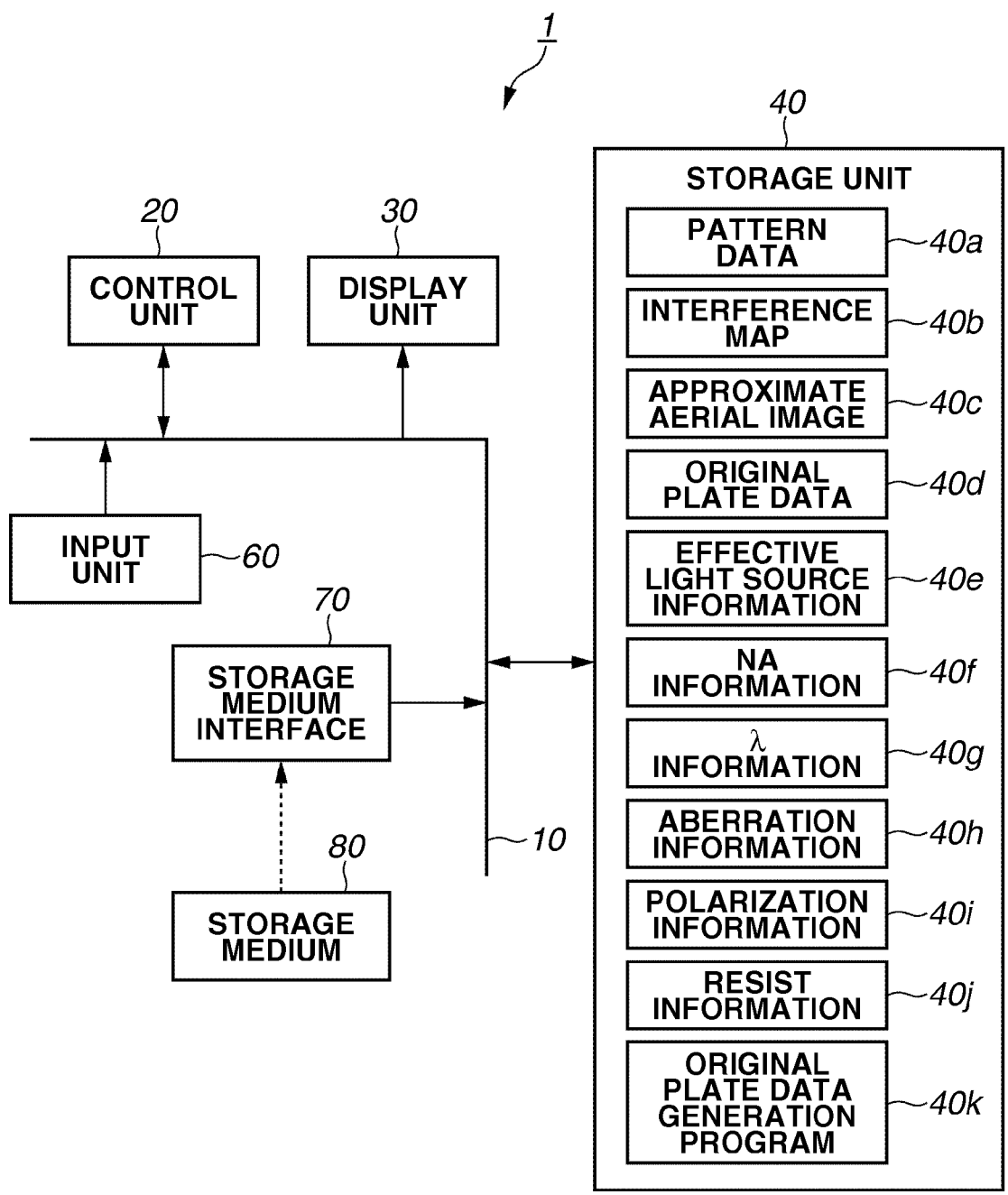
FIG. 1 illustrates an example configuration of a computer according to exemplary embodiments of the present invention.

Referring to FIG. 1, a computer 1 includes a bus 10, a control unit 20, a display unit 30, a storage unit 40, an input unit 60, and a storage medium interface 70. The control unit 20, the display unit 30, the storage unit 40, the input unit 60, and the storage medium interface 70 are connected to one another via the bus 10. A storage medium 80 can be connected to the storage medium interface 70.

The storage unit 40 stores pattern data 40a, an interference map 40b, an approximate aerial image 40c, original plate (a mask or a reticle) data 40d, effective light source information 40e, NA information 40f, λ information 40g, aberration information 40h, polarization information 40i, resist information 40j, and an original plate data generation program 40k.

The pattern data 40a is information about a pattern arranged on a mask surface (an object plane) of the projection optical system. The pattern data 40a is necessary for calculating an interference map or an approximate aerial image, which will be described below. The pattern data 40a can be data of a pattern whose layout is designed in a designing process of an integrated circuit (IC) (hereinafter referred to as a "layout pattern") itself or a pattern including an auxiliary pattern.

The approximate aerial image 40c indicates a distribution of the approximate aerial images on a wafer surface, which will be described below. The original plate data 40d is data for drawing a pattern made of chromium (Cr) on the mask surface.

The effective light source information 40e is information about a distribution of the intensity of light formed on a pupil plane 142 of a projection optical system 140 of an exposure apparatus 100, which will be described below (see FIG. 9). In addition, the effective light source 40e is equivalent to a distribution of an angle of a light flux incident on the mask surface of the projection optical system 140.

The NA information 40f is information about the number of numerical apertures NA on the image side of the projection optical system 140. The λ information 40g is information about a wavelength λ of an exposure light emitted from the exposure apparatus 100.

The aberration information 40h is information about aberrations occurring in the projection optical system 140. When double refraction occurs in the projection optical system 140, a phase shift occurs due to the double refraction. Here, the phase shift can be considered as a kind of aberration.

The polarization information 40i is information about the polarization of the illumination light emitted from an illumination device 110 of the exposure apparatus 100. The resist information 40j is information about the photo-sensitive resist to be coated on a wafer.

The interference map 40b is an interference map discussed in Japanese Patent Application Laid-Open No. 2004-221594. The original plate data generation program 40k is a program for generating data such as an original plate pattern.

The control unit 20 is a central processing unit (CPU), a graphical processing unit (GPU), a digital signal processor (DSP), or a microcomputer. The control unit 20 includes a cache memory for temporarily storing data or information.

The display unit 30 is a display device such as a cathode ray tube (CRT) display or a liquid crystal display. The storage unit 40 is a memory or a hard disk. The input unit 60 is an input device such as a keyboard and a pointing device such as a mouse.

The storage medium interface 70 is a floppy disk drive, a compact disk read only memory (CD-ROM) drive, or a universal serial bus (USB) interface, for example. The storage medium 80 is, for example, a floppy disk, a CD-ROM, or a USB memory.

A method for generating an original plate pattern by arranging an auxiliary pattern using an interference map or an approximate aerial image according to the present exemplary embodiment will be described. The dimensions of a pattern on the mask surface and that on the wafer surface differ corresponding to a magnification of the projection optical system 140. However, it is supposed for easier understanding that the dimension of the pattern on the mask surface corresponds one-on-one to that on the wafer surface by multiplying the dimension of the pattern on the mask surface by the magnification. Therefore, a coordinate system for the mask surface corresponds one-on-one to that for the wafer surface.

An interference map can be derived from an eigen function and an eigenvalue of a transmission cross coefficient (TCC) (an eigenvalue decomposition method), as discussed in Japanese Patent Application Laid-Open No. 2004-221594. That is, the interference map $e(x, y)$ can be expressed as follows:

$$e(x, y) = \sum_{i=1}^{N'} \sqrt{\lambda_i}\, FT[a(f, g)\Phi_i(f, g)] \quad (1)$$

where "$\Phi_i$"(x, y) denotes an i-th eigenfunction, "$\lambda_i$" denotes an i-th eigenvalue, "FT" denotes the Fourier transform, and "a(f, g) denotes a diffracted light distribution of the pattern on the mask surface. When expressed by a function, the interference map is the Fourier transform of a function indicating a pattern on the mask surface (mask function). "N'" usually has a numerical value "1".

Now, a value indicated in the interference map is described. When an interference map is calculated for a pattern A on an object plane (mask surface) of an optical system, the resulting value at each position of the interference map indicates a degree of interference between the light from each position and the light reflected from the pattern A. As the value becomes greater, the resolution for the pattern A can be improved because the light from each position is intensified with the light from the pattern A. For example, the light from a position at which the value indicated by the interference map is "0" does not interfere with the diffracted light from the pattern A.

A method for deriving an approximate aerial image will be described. A mask pattern and a wafer pattern (image of the mask pattern) in a semiconductor exposure apparatus are in a mutual relationship of a partial coherent image formation. The partial coherent image formation can be calculated using the TCC.

The TCC is generally defined as a coefficient on a pupil plane of a projection optical system. More specifically, the TCC is an overlapped portion among an effective light source, a pupil function of the projection optical system, and a complex conjugate of the pupil function for the projection optical system.

The TCC can be expressed by the following expression:

$$TCC(f', g', f'', g'') = \iint S(f,g) P(f+f', g+g') P^*(f+f'', g+g'') df dg \quad (2)$$

where "(f, g)" denotes a coordinate on the pupil plane, "S(f, g)" denotes a function indicating an effective light source, "P(f, g)" denotes a pupil function, "*" denotes a complex conjugate, and the range of integration is from "$-\infty$" to "$\infty$".

The aberration in the projection optical system, the polarization of the illumination light, and the resist information can be included in the pupil function P(f, g). Accordingly, the term "pupil function" used herein can include the polarization, the aberration, and the resist information.

An aerial image I(x, y) can be calculated by performing a quartet integration using the TCC as follows:

$$I(x,y) = \iiiint TCC(f',g',f'',g'') a(f,g) a^*(f',g') \times \exp\{-i2\pi[(f'-f'')x + (g'-g'')y]\} df'dg'df''dg'' \quad (3)$$

where "a(f, g)" denotes a function indicating a diffracted light distribution of the pattern on the object plane (the function obtained by Fourier-transforming the pattern on the object plane).

To perform the calculation by the expression (3) on a computer, it is useful to discretize the data as follows:

$$I(\hat{x}, \hat{y}) = \sum_{\hat{f}', \hat{g}', \hat{f}'', \hat{g}''} TCC(\hat{f}', \hat{g}', \hat{f}'', \hat{g}'') a(\hat{f}', \hat{g}') a^*(\hat{f}'', \hat{g}'') \times$$
$$\exp\{-i2\pi[(\hat{f}' - \hat{f}'')\hat{x} + (\hat{g}' - \hat{g}'')\hat{y}]\}$$

where the variables with a hat denote variables discretized for calculation by computer. Hereinafter, it is supposed for easier understanding that the variables are discretized even if they have no hat.

The expression (4) includes a term similar to a Fourier transform format, and a simple addition is only repeated in the expression (4). It is useful to perform a calculation combining the Fourier transform and an addition loop, as expressed in an expression (5) below by modifying the expression (4):

$$I(x, y) = \quad (5)$$
$$\sum_{f', g'} a(f', g') \exp[-i2\pi(f'x + g'y)] \times F^{-1}[W_{f', g'}(f'', g'') a^*(f'', g'')]$$

where "$F^{-1}$" denotes the inverse Fourier transform.

A term "$W_{f', g'}(f'', g'')$" in the expression (5) can be defined with respect to a fixed term "(f', g')" as follows:

$$W_{f', g'}(f'', g'') = TCC(f', g', f'', g'') \quad (6).$$

Because the term "(f', g')" is fixed, the function "$W_{f', g'}(f'',g'')$" is a two-dimensional function, which herein is referred to as a "two-dimensional transmission cross coefficient". The two-dimensional transmission cross coefficient "$W_{f', g'}(f'', g")" is an addition loop, and is re-calculated everytime the value for the term (f', g') varies.

In expression (5), the TCC, which is a four-dimensional function as shown in the expression (2), is not necessary and the expression (5) performs only the double loop calculation. The expression (5) can be alternatively expressed as follows:

$$I(x, y) = \sum_{f',g'} Y_{f',g'}(x, y) \quad (7)$$

where $$Y_{f',g'}(x, y) = \quad (8)$$
$$a(f', g')\exp[-i2\pi(f'x + g'y)] \times F^{-1}[W_{f',g'}(f'', g'')a^*(f'', g'')].$$

The method for calculating an aerial image expressed by the expressions (7) and (8) is referred to herein as an aerial image decomposition method. The function "$Y_{f',g'}(x, y)$" defined for each coordinate (f', g') is referred to as an aerial image component expressing function (aerial image component).

Here, the number of combinations of the term (f', g') is "M", and "M'" is an integer equal to or less than a value M. Furthermore, a value "m" denotes a combination for the term (f', g'). If m=1, then f'=g'=0. An aerial image approximated by components ranging from M of aerial images to m=1–M' under the above condition can be defined by the following expression:

$$I_{app}(x, y) \approx \sum_{m=1}^{M'} Y_{f',g'}(x, y). \quad (9)$$

If M'=1, then the approximate aerial image indicates a function "$Y_{0,0}(x, y)$". If M'=M, namely, the calculation using the expression (5) can be applied and a full aerial image can be obtained.

The function "$W_{f',g'}(f'', g'')$", as can be seen from the expression (5), assigns weights to diffracted light distribution (spectrum distribution) of the mask. If (f', g')=(0, 0), then it is apparent that the function "$W_{0,0}(f'', g'')$" has a greatest effect of all the two-dimensional transmission cross coefficients because the effective light source overlaps with the pupil function for the projection optical system. Accordingly, if M'=1 in the expression (9), a particularly significant approximate aerial image can be obtained.

Now, a physical meaning of an aerial image will be described in detail. In the case of performing coherent image formation, a point spread function (a function expressing a distribution of intensity of a point image) can be determined.

If a position at which the point spread function is positive is taken as the aperture and a position at which the point spread function is negative is taken as a light shielding section (alternatively, an aperture whose phase is 180 degrees), then a pattern having a similar function to a Fresnel lens can be generated. By performing coherent illumination using the generated pattern as the mask, an isolated contact hole can be exposed.

The Fresnel lens can be defined when coherent illumination is performed based on the point spread function. However, in the case of partially coherent image formation, a point spread function cannot be calculated because an image plane amplitude cannot be calculated during the partially coherent image formation.

A point spread function can be calculated by Fourier-transformation of a modulation transfer function. The modulation transfer function during coherent illumination can be calculated by convolution integration of the pupil function and the effective light source, which results in the pupil function itself.

In addition, it is well-known that the modulation transfer function during incoherent illumination can be calculated by an autocorrelation of the pupil function. With respect to incoherent illumination, if σ=1 in the illumination by the exposure apparatus, then the modulation transfer function can be obtained by the effective light source for the pupil function even during incoherent illumination.

The modulation transfer function during partially coherent illumination can be approximated by convolution integration of the pupil function and the effective light source. That is, "$W_{0,0}(f'', g'')$" is approximated as the modulation transfer function. Therefore, by Fourier-transform of the function "$W_{0,0}(f'', g'')$", the point spread function during the partial coherent illumination can be calculated.

By determining the aperture and the light-shielding section of the mask according to the point spread function calculated in the above-described manner, an isolated contact hole can be exposed producing the same effect as that of a Fresnel lens.

In order to improve image forming performance with respect to an arbitrary mask pattern, it is useful to determine a mask pattern based on a result of convolution integration of the point spread function and the mask function.

When the expression (8) is closely examined, it can be seen that a result of Fourier-transform of a product of the diffracted light and the function "$W_{0,0}(f'', g'')$" is equivalent to the function "$Y_{0,0}(x, y)$". Here, the diffracted light is a Fourier transform of the mask function and the function "$W_{0,0}(f'', g'')$" is equivalent to a Fourier transform of the point spread function. Therefore, based on the mathematical formula, the function "$Y_{0,0}(x, y)$" is a convolution integration of the mask function and the point spread function.

As described above, the deriving of the approximate aerial image "$Y_{0,0}(x, y)$" according to the present exemplary embodiment is equivalent to the calculation of the convolution integration of the point spread function and the mask function during partially coherent image formation.

As described above, the function "$W_{0,0}(f'', g'')$" is an approximation of the modulation transfer function during partially coherent illumination. The function "$W_{f',g'}(f'', g'')$" other than the function "$W_{0,0}(f'', g'')$" is the modulation transfer function omitted at the time of approximating the modulation transfer function during partially coherent illumination. Therefore, the function "$Y_{f',g'}(x, y)$" other than the function "$Y_{0,0}(x, y)$" is a component omitted at the time of convolution-integration of the point spread function and the mask pattern during partially coherent illumination. Therefore, if M'≧1 in the expression (9), then the accuracy of approximation can be improved.

Now, a value that an approximate aerial image represents is described. If an approximate aerial image is calculated for a pattern B on the object plane (mask surface), then the value at each position of the approximate aerial image indicates a degree of interference and intensification between the light from each position and the light from the pattern B. Thus, the resolution of the pattern A can be improved as in the case of using the interference map.

Therefore, in determining a pattern on the mask surface (mask pattern) using an approximate aerial image or an interference map, it is useful to arrange a pattern at a position at which the value for the approximate aerial image or the interference map reaches a peak (extreme value). It is useful to arrange a primary pattern SP at the position at which the value for the approximate aerial image or the interference map reaches a maximum value and to arrange auxiliary patterns HP which are not resolved at positions at which the value for the approximate aerial image and the interference map reaches a peak. By generating a mask using the data for the arranged pattern as the original plate data, a target pattern can be formed with a high accuracy because the diffracted light from the auxiliary pattern acts on the diffracted light from the primary pattern.

Now, a process flow of an original plate data generation method for generating original plate data will be described below with reference to a flow chart of FIG. 2.

Figure 2:
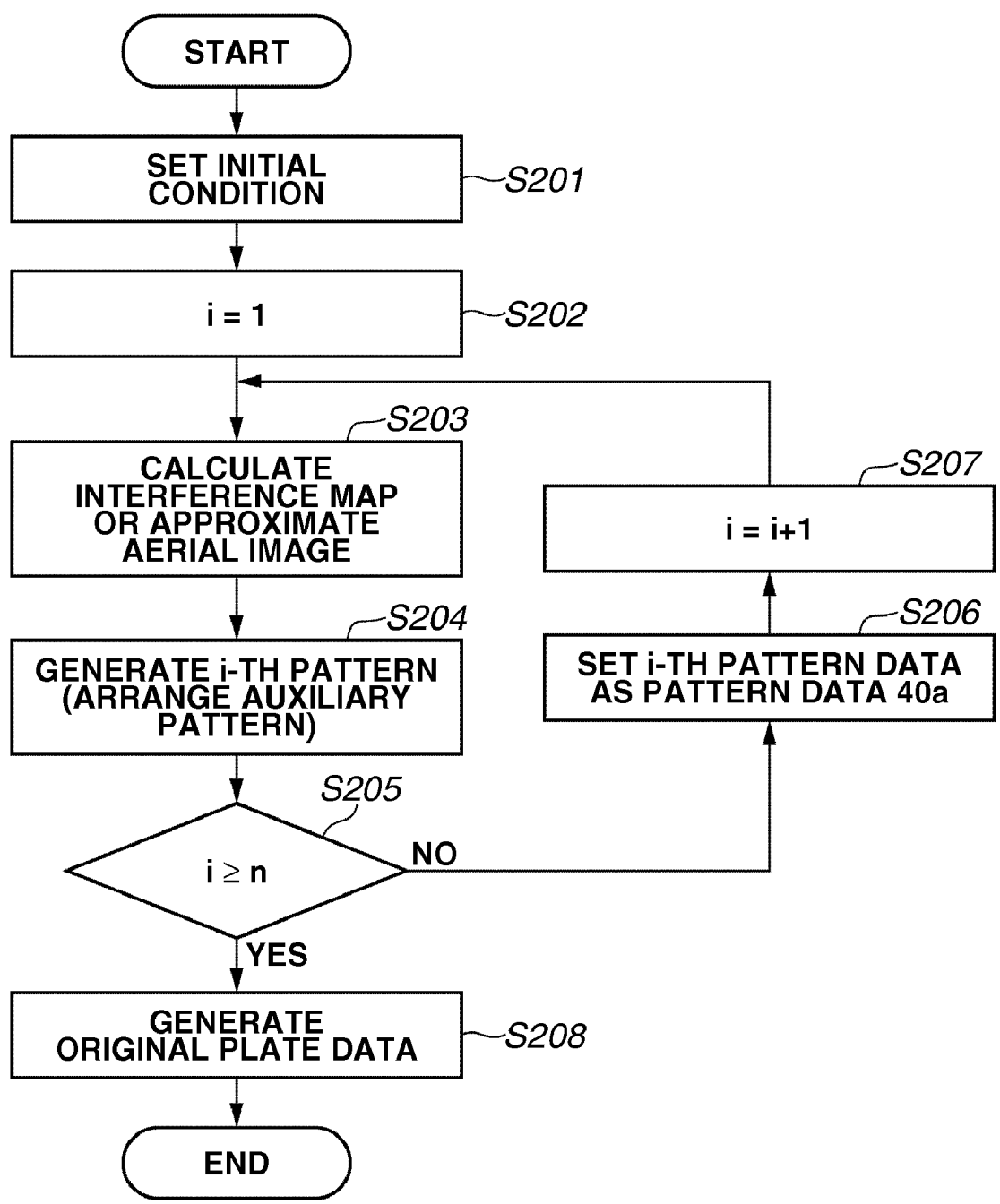
FIG. 2 is a flow chart illustrating an example original plate data generation processing according to the exemplary embodiments of the present invention.

Referring to FIG. 2, in step S201, the control unit 20 of the computer 1 sets initial values for various data of the exposure apparatus. More specifically, the control unit 20 determines and sets the pattern data 40a, the effective light source information 40e, the NA information 40f, the λ information 40g, the aberration information 40h, the polarization information 40i, and the resist information 40j.

A user previously inputs, via the input unit 60, the pattern data 40a (FIG. 3A), the effective light source 40e (FIG. 3B), the λ information 40g (248 nm, for example), and the polarization information 40i (for example, "unpolarized"). In addition, the user previously inputs via the input unit 60 the resist information 40j (for example, "not considered"), the NA information 40f (for example, "0.73"), and the aberration information 40h ("no aberration", for example). The control unit 20 receives the input information from the input unit 60 and stores the received information on the storage unit 40.

The pattern data 40a, the effective light source information 40e, the λ information 40g, the polarization information 40i, the resist information 40j, the NA information 40f, and the aberration information 40h are hereafter collectively referred to as "calculation information" for calculating the interference map 40b or the approximate aerial image 40c.

The storage medium 80 storing the original plate data generation program 40k is connected to the storage medium interface 70. Accordingly, the original plate data generation program 40k is stored on the storage unit 40 via the control unit 20 at the time of installation thereof.

A user inputs an instruction for starting the original plate data generation process via the input unit 60. Upon receiving the instruction for starting the original plate data generation program 40k, the control unit 20 refers to the storage unit 40 to start the original plate data generation program 40k. Then, the control unit 20 displays the calculation information for calculating the interference map 40b or the approximate aerial image 40c on the display unit 30 according to the original plate data generation program 40k. Furthermore, the control unit 20, in response to the user instruction, determines and stores the calculation information for the interference map 40b or the approximate aerial image 40c.

In step S202, the control unit 20 assigns a numerical value "1" for an operator "i" as its initial value. Here, the operator i can be assigned with a positive integer equal to or greater than 1.

In step S203, the control unit 20 generates the interference map 40b or the approximate aerial image 40c. Then, the user inputs an instruction for calculating the interference map 40b or the approximate aerial image 40c via the input unit 60.

Upon receiving the instruction for calculating the interference map 40b or the approximate aerial image 40c, the control unit 20 refers to the storage unit 40 according to the received user instruction. The control unit 20 receives the calculation information from the storage unit 40. The control unit 20, using the expression (1) or the expressions (2) through (9), calculates the interference map 40b or the approximate aerial image 40c based on the information stored on the storage unit 40.

Here, the control unit 20 calculates the interference map 40b and the approximate aerial image 40c using the pattern on the object plane of the projection optical system as the layout pattern indicated by the pattern data 40a. Furthermore, the control unit 20 displays the calculated interference map 40b or approximate aerial image 40c on the display unit 30.

In step S204, the user who has viewed the pattern data 40a and the approximate aerial image 40c arranges the primary patterns and the auxiliary patterns based on the interference map 40b or the approximate aerial image 40c calculated by the control unit 20.

As described above, the primary patterns and the auxiliary patterns which transmit light are arranged at positions at which the value for the interference map 40b or the approximate aerial image 40c reaches a peak or an area satisfying a predetermined condition. The primary patterns are arranged at positions corresponding to the position of the pattern on the object plane of the projection optical system (generally, the positions are nearly the same). The auxiliary patterns which are not resolved are arranged at positions at which the value for the interference map 40b or the approximate aerial image 40c reaches a peak. The layout pattern indicated by the pattern data itself, the layout pattern whose dimension is changed, and the layout pattern whose position is changed can be used as the primary pattern.

After receiving the instruction for disposing the primary patterns and the auxiliary patterns, the control unit 20 arranges the primary patterns and the auxiliary patterns based on the received instruction. Furthermore, the control unit 20 determines a transmissivity of the portion of the mask surface on which no pattern is drawn (namely, a background transmissivity). The control unit 20 refers to the storage unit 40 and generates a first pattern including the primary patterns, the auxiliary patterns, and the mask background transmissivity information.

In step S205, the control unit 20 determines whether the operator i is equal to or greater than a predetermined number n (n is a positive integer of 2 or greater). If it is determined in step S205 that the operator i is equal to or greater than the value n (YES in step S205), then the processing advances to step S208. On the other hand, if it is determined in step S205 that the operator i is smaller than the value n (NO in step S205), then the processing advances to step S206. In the present exemplary embodiment, if n=2 and i=1, then the processing advances to step S206.

In step S206, the control unit 20 substitutes the pattern data 40a with the i-th pattern generated in step S204. In step S207, the control unit 20 adds 1 to the operator i and sets i=2.

Then the processing returns to step S203 and the control unit 20 calculates the interference map 40b or the approximate aerial image 40c again using the pattern data 40a, namely the data for the first pattern. In step S204, the control unit 20 generates a second pattern further including auxiliary patterns at positions at which the value reaches a peak or in a portion satisfying a predetermined condition based on the approximate aerial image 40c or the interference map 40b calculated in step S203.

In step S205, the control unit 20 determines whether the operator i is equal to or greater than the value n. If it is determined in step S205 that n=2 (i.e., n=i=2) (YES in step S205), then the processing ends the loop processing, and advances to step S208. In step S208, the control unit 20 generates the original plate data 40d using the second pattern as the original plate pattern. Then, the control unit 20 displays the original plate data 40*d* on the display unit 30 and stores the original plate data 40*d* on the storage unit 40.

As described above, in the processing using the original plate data generation program 40*k* according to the present exemplary embodiment, the calculation for the interference map or the approximate aerial image and the disposition (arrangement) of the auxiliary pattern are repeated to generate the original plate data 40*d*. The number of repeated calculations is not limited to a specific number. That is, the number of repeated calculations can be determined by considering the costs for generating the original plate and the effect of improving the throughput of the exposure apparatus. The repeated calculations comprise an iterative process.

Instead of the data obtained at a last calculation of the repeated calculations, the data obtained in the middle of the repeated calculations, for example, the data obtained at a next-to-last calculation of the repeated calculations, can be used as the original plate data 40*d*.

Furthermore, the original plate data 40*d* can include not only the data generated based on the interference map or the approximate aerial image described above but also other data. The other data can include a layout pattern that is not arranged as an auxiliary pattern, a scattering bar, or a pattern arranged by an optical process correction (OPC).

Furthermore, as a method for generating an original plate, it is also useful to generate an original plate having a pattern made of Cr based on the input original plate data 40*d* which is generated by an electron beam (EB) lithography apparatus.

Now, the arrangement of the auxiliary patterns in step S204 will be described. Various methods can be used for arranging the auxiliary patterns. First, a method for arranging the auxiliary patterns at peak positions of an interference map or an approximate aerial image can be used. Secondly, a method for arranging the auxiliary patterns at positions at which a differential value of the interference map or the approximate aerial image becomes 0 can be used.

Moreover, the auxiliary patterns can be arranged at a barycentric position of an area in which the interference map or the approximate aerial image has a value equal to or greater (or smaller) than a predetermined threshold value. In this case, the barycentric position can be calculated by processing the area in which the interference map or the approximate aerial image has a value equal to or greater than (or smaller than) the predetermined threshold value as a closed region.

The light flux from the auxiliary patterns arranged in the above-described manner and the light flux from the primary pattern intensify each other to form a target pattern on a photosensitive material.

Furthermore, it is useful to calculate an interference map or an approximate aerial image based on the pattern for which an auxiliary pattern is once arranged and further arrange another auxiliary pattern. In this case, the light intensity of the position at which the target pattern is formed is increased. As a result, the resolution of the exposure apparatus 100 can be improved by performing a pattern-exposure using the mask provided with auxiliary patterns arranged in the above-described manner. Furthermore, the throughput of the exposure apparatus 100 can be improved due to an increase in the light intensity.

In the following exemplary embodiments of the present invention, a method for generating original plate data using an interference map or aerial image components, effects of the present invention, and other aspects of the present invention will be described in detail with reference to the drawings.

A first exemplary embodiment of the present invention is described below. In the present exemplary embodiment, it is supposed that the wavelength of the light source of the exposure apparatus is 248 nm and the NA for the projection optical system is 0.86. It is further supposed that no aberration occurs in the projection optical system, the illumination light is not polarized, and the resist is not considered.

Figure 3A:
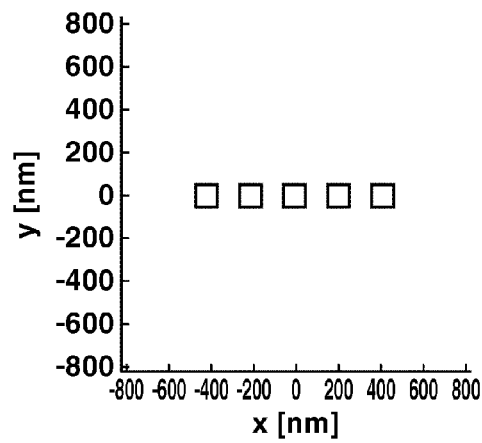
FIGS. 3A through 3F illustrate original plate data generation processing according to a first exemplary embodiment of the present invention.

With respect to a target pattern to be formed on a wafer, five contact holes each having a diameter of 100 nm are arranged in a single row. Accordingly, as illustrated in FIG. 3A, the layout pattern includes five 100 nm×100 nm patterns arranged in a single row. Data for the patterns is used as the pattern data 40*a*. The effective light source information 40*e* is determined based on the effective light source as shown in FIG. 3B.

Figure 3B:
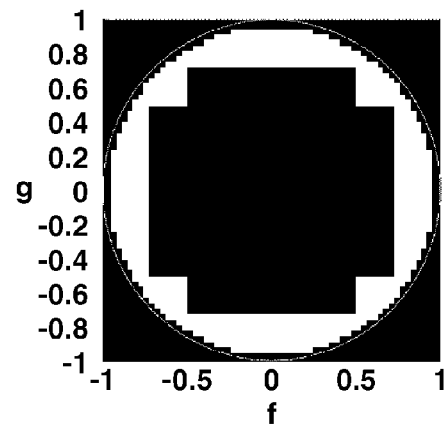

Referring to FIG. 3B, vertical and horizontal axes indicate mutually orthogonal coordinate axes on the pupil plane of the projection optical system. The degree of light and dark corresponds to the light intensity.

In the present exemplary embodiment, an NA value "0.86" is set for the NA information 40*f*. A wavelength value "248 nm" is set for the λ information 40*g*. The aberration information 40*h*, the polarization information 40*i*, and the resist information 40*j* are set "null".

Figure 3C:
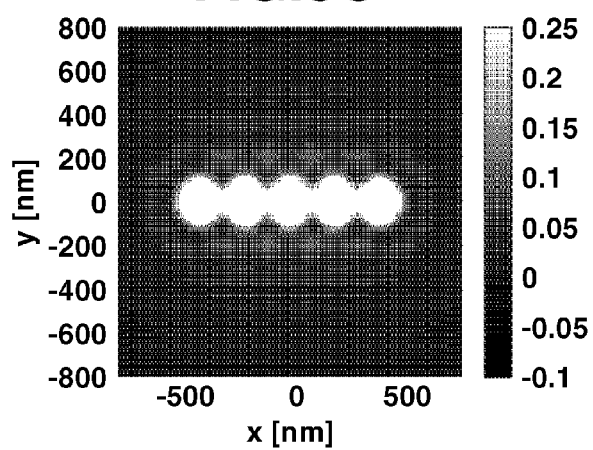

FIG. 3C illustrates a calculation result of the function "$Y_{0, 0}(x, y)$" as an approximate aerial image. Vertical and horizontal axes in FIGS. 3C and 3E indicate mutually orthogonal coordinate axes on the image plane. The degree of light and dark at each position indicates an image intensity value, as indicated with a numerical value in a right portion of FIGS. 3C and 3E.

When primary patterns SP1 through SP5 (equivalent to the patterns illustrated in FIG. 3A) and auxiliary patterns (patterns indicated as black-line squares other than the primary patterns SP1 through SP5) are arranged at approximate aerial image peak positions (FIG. 3C), a first pattern (FIG. 3D) can be obtained. In the present exemplary embodiment, the primary patterns and the auxiliary patterns are transmission portions each having a light transmissivity of 100%. The background transmissivity is 0%.

The pattern on the object plane of the projection optical system is replaced with the first pattern (FIG. 3D), and the pattern data 40*a* is used as the data for the first pattern. FIG. 3E illustrates a calculation result of the function "$Y_{0, 0}(x, y)$" based on the pattern data 40*a*.

Then, peak positions for the approximate aerial image illustrated in FIG. 3E are detected, and auxiliary patterns are arranged at the detected peak positions. In this manner, a second pattern including auxiliary patterns HP1 through HP10 arranged around the first pattern (FIG. 3F) can be obtained. The resulting second pattern is used as the original plate data 40*d*. The light transmissivity of each of the auxiliary patterns HP1 through HP10 is 100% in the present exemplary embodiment.

Figure 3D:
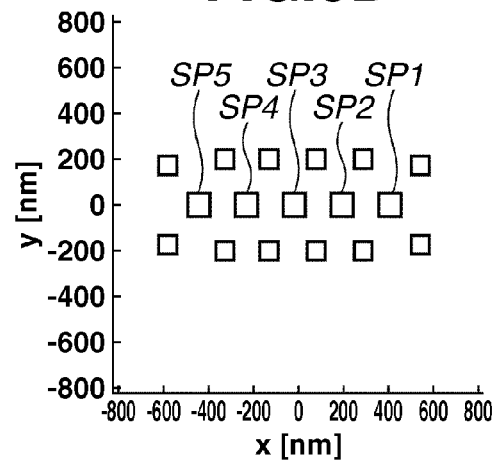
Figure 3E:
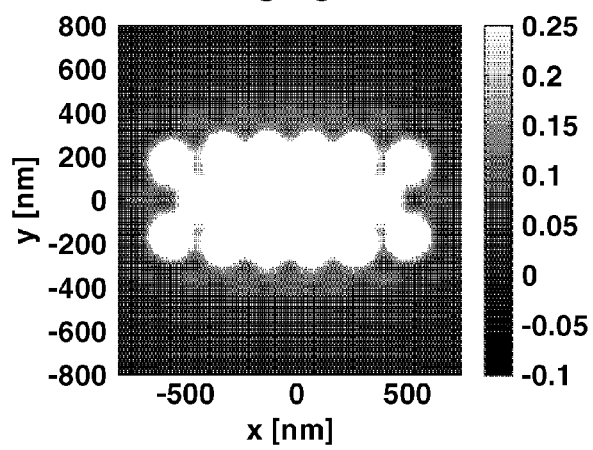
Figure 3F:
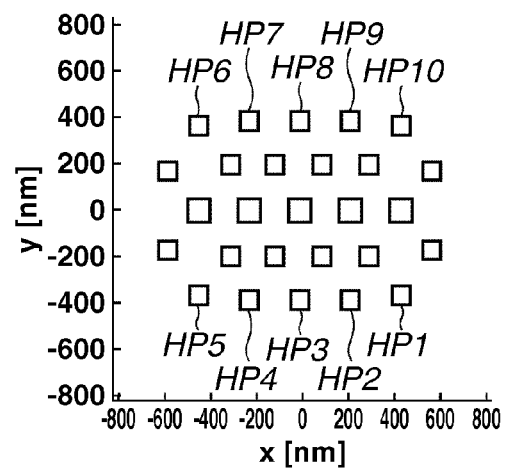
Figure 4A:
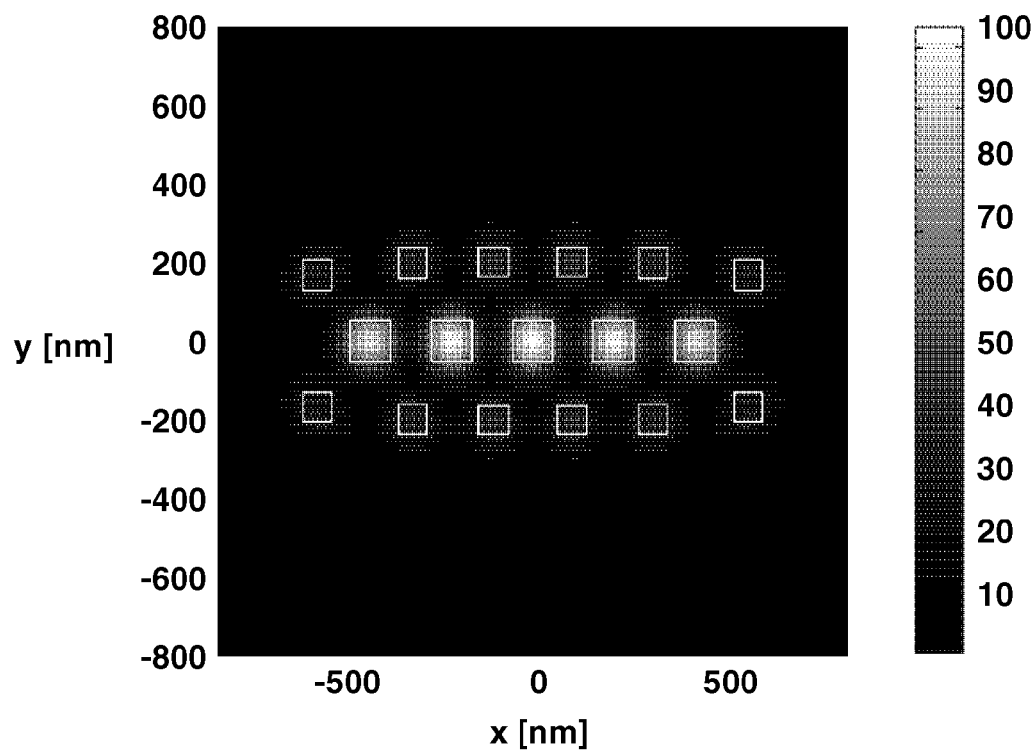
FIGS. 4A and 4B illustrate an aerial image simulation result according to the first exemplary embodiment of the present invention.
Figure 4B:
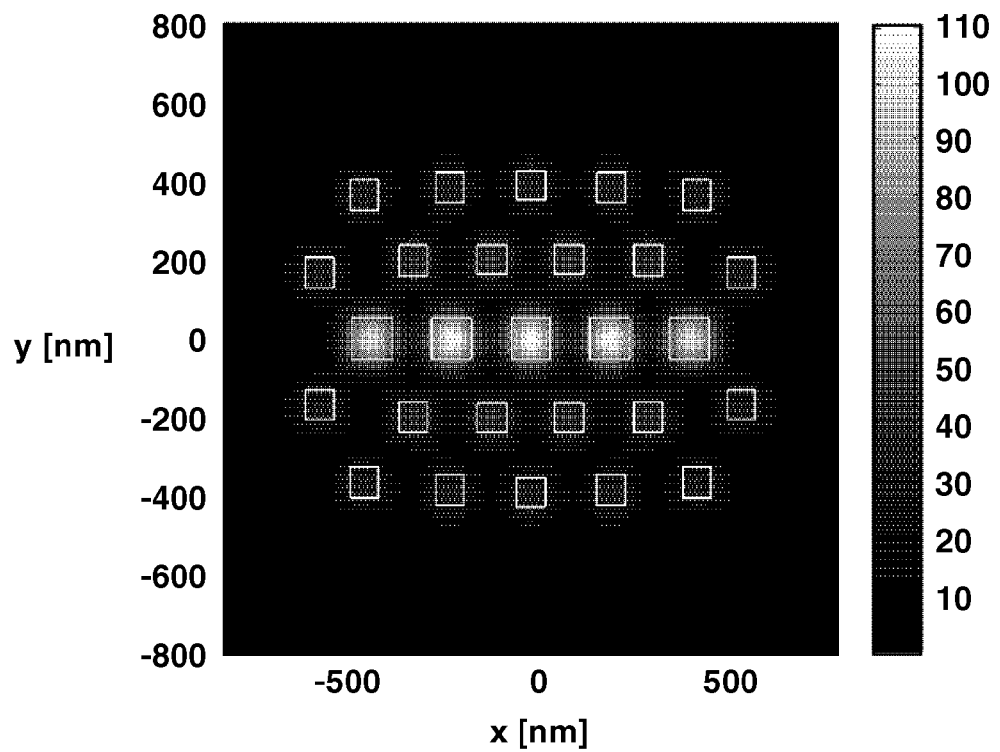

FIG. 4A illustrates a result of an aerial image simulation performed using the mask pattern illustrated in FIG. 3D. FIG. 4B illustrates a result of an aerial image simulation performed using the mask pattern illustrated in FIG. 3F.

Vertical and horizontal axes in FIGS. 4A and 4B indicate mutually orthogonal coordinate axes on the image plane. The degree of light and dark at each position indicates a light intensity value, as indicated with a numerical value in a right portion of FIGS. 4A and 4B. In the examples of FIGS. 4A and 4B, white-line squares correspond to primary patterns and auxiliary patterns illustrated in FIGS. 3D and 3F, which plainly indicate the patterns and the results of the calculation. Because the dimension of the mask surface and that of the wafer surface are supposed to be equivalent to each other in the present exemplary embodiment, the position of the patterns on the mask surface and the position on the wafer surface can be appropriately reduced in an actual reduction projection optical system.

Figure 5:
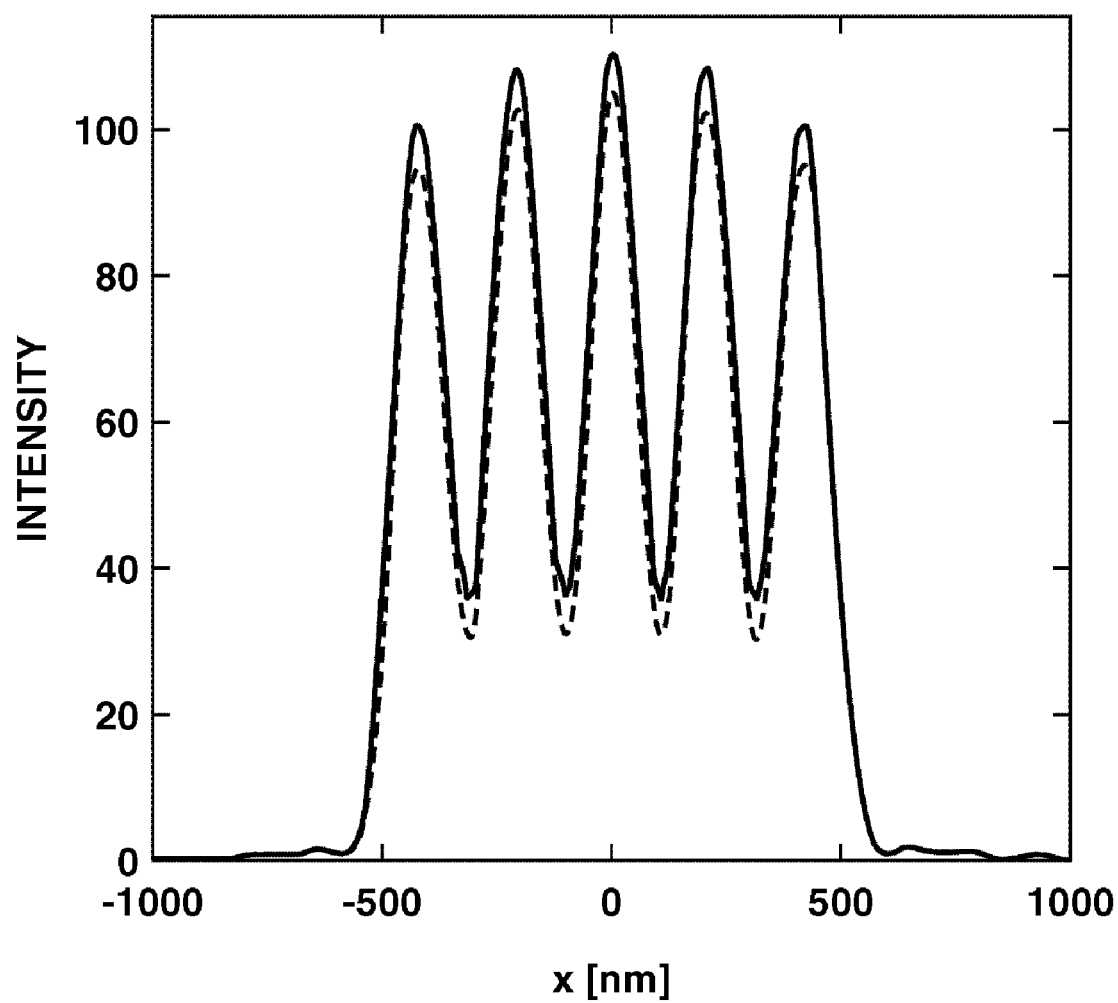
FIG. 5 illustrates a graph showing the result in FIGS. 4A and 4B according to the first exemplary embodiment of the present invention.

FIG. 5 illustrates results of the calculation illustrated in FIGS. 4A and 4B in a graph according to the first exemplary embodiment of the present invention. In FIG. 5, a horizontal axis indicates a position x, a vertical axis indicates a light intensity obtained when y=0, a dotted line illustrates a result of the calculation illustrated in FIG. 4A, and a solid line illustrates a result of the calculation illustrated in FIG. 4B.

As can be seen from FIG. 5, a maximum intensity in the example in FIG. 4B is higher than the example of FIG. 4A. More specifically, the maximum intensity in the example in FIG. 4B is higher than the example of FIG. 4A by 6%. That is, the light intensity (light quantity) at the position at which a target pattern is formed becomes high.

Therefore, if the original plate (mask) is generated using the pattern illustrated in FIG. 3F as the original plate data 40d, the present exemplary embodiment can further improve the resolution and the throughput of the exposure apparatus than in the case of using the pattern illustrated in FIG. 3F as the original plate data 40d.

A second exemplary embodiment of the present invention is described below. In the present exemplary embodiment, it is supposed that the wavelength of the light source of the exposure apparatus is 248 nm and the NA for the projection optical system is 0.86. It is further supposed that no aberration occurs in the projection optical system, the illumination light is not polarized, and the resist is not considered.

Figure 6A:
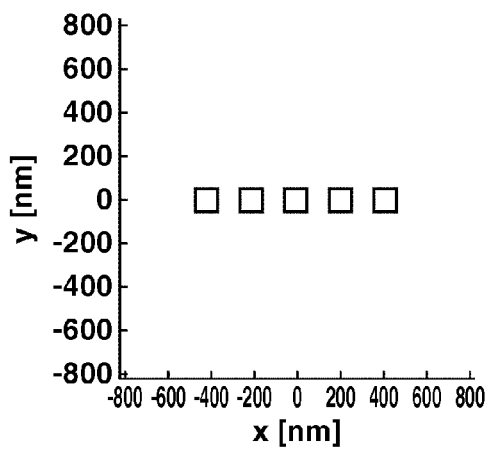
FIGS. 6A through 6F illustrate original plate data generation processing according to a second exemplary embodiment of the present invention.
Figure 6B:
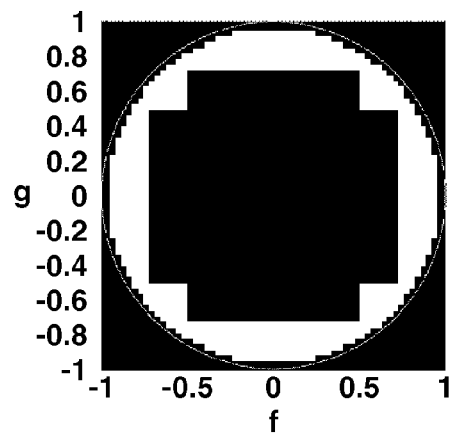

In the present exemplary embodiment, as in the first exemplary embodiment, with respect to a target pattern to be formed on a wafer, five contact holes each having a diameter of 100 nm are arranged in a single row. Accordingly, as illustrated in FIG. 6A, the layout pattern includes five 100 nm×100 nm patterns arranged in a single row. Data for the patterns is used as the pattern data 40a. FIG. 6B illustrates the effective light source. The effective light source information 40e is determined based on the effective light source.

Referring to FIG. 6B, vertical and horizontal axes indicate mutually orthogonal coordinate axes on the pupil plane of the projection optical system. The degree of light and dark corresponds to the light intensity.

In the present exemplary embodiment, an NA value "0.86" is set for the NA information 40f. A wavelength value "248 nm" is set for the λ information 40g. The aberration information 40h, the polarization information 40i, and the resist information 40j are set "null".

Figure 6C:
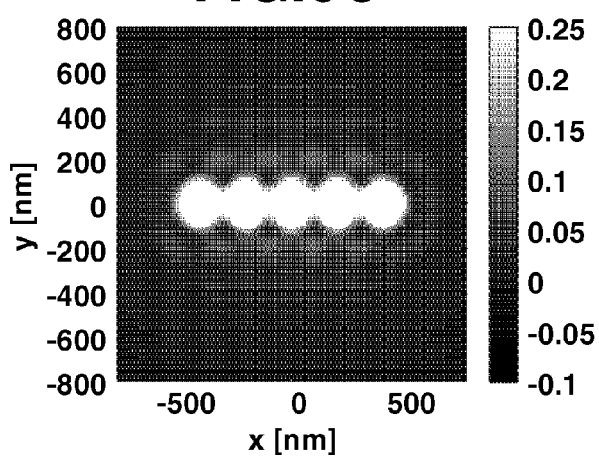

The calculation information for the interference map is set as described above. FIG. 6C illustrates a result of the calculation for the interference map using the information.

Figure 6D:
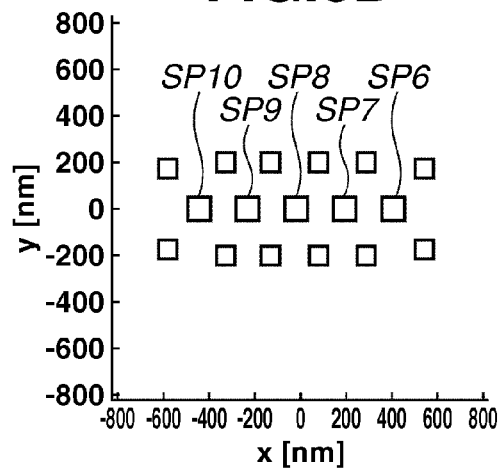
Figure 6E:
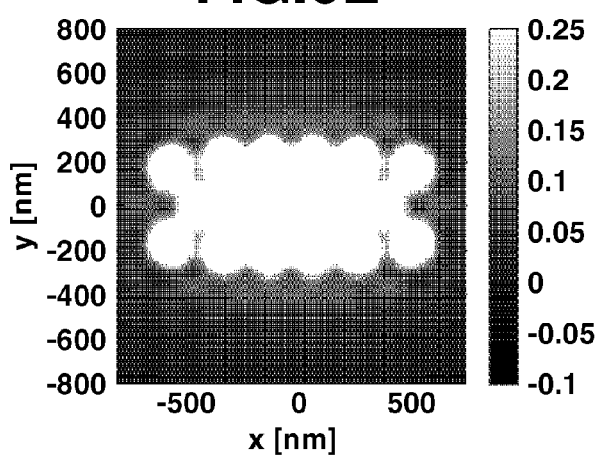

Vertical and horizontal axes in FIGS. 6C and 6E indicate mutually orthogonal coordinate axes on the object plane. The degree of light and dark at each position indicates an image plane intensity (amplitude) value, as indicated with a numerical value in a right portion of FIGS. 6C and 6E.

When primary patterns SP6 through SP10 (equivalent to the patterns illustrated in FIG. 6A) and auxiliary patterns (patterns indicated as black-line squares other than the primary patterns SP6 through SP10) are arranged at peak positions (FIG. 6C), a first pattern (FIG. 6D) can be obtained. In the present exemplary embodiment, the primary patterns and the auxiliary patterns are transmission portions each having a light transmissivity of 100%. The background transmissivity is 0%.

The pattern on the object plane of the projection optical system is replaced with the first pattern (FIG. 6D), and the pattern data 40a is used as the data for the first pattern. FIG. 6E illustrates a calculation result of the interference map based on the pattern data 40a.

Then, peak positions for the interference map illustrated in FIG. 6E are detected, and auxiliary patterns are arranged at the detected peak positions. In this manner, a second pattern including auxiliary patterns HP11 through HP22 arranged around the first pattern (FIG. 6F) can be obtained. The resulting second pattern is used as the original plate data 40d. The light transmissivity of each of the auxiliary patterns HP11 through HP22 is 100% in the present exemplary embodiment.

Figure 6F:
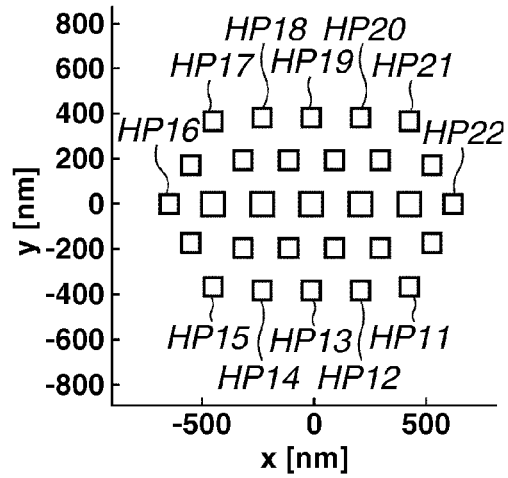
Figure 7A:
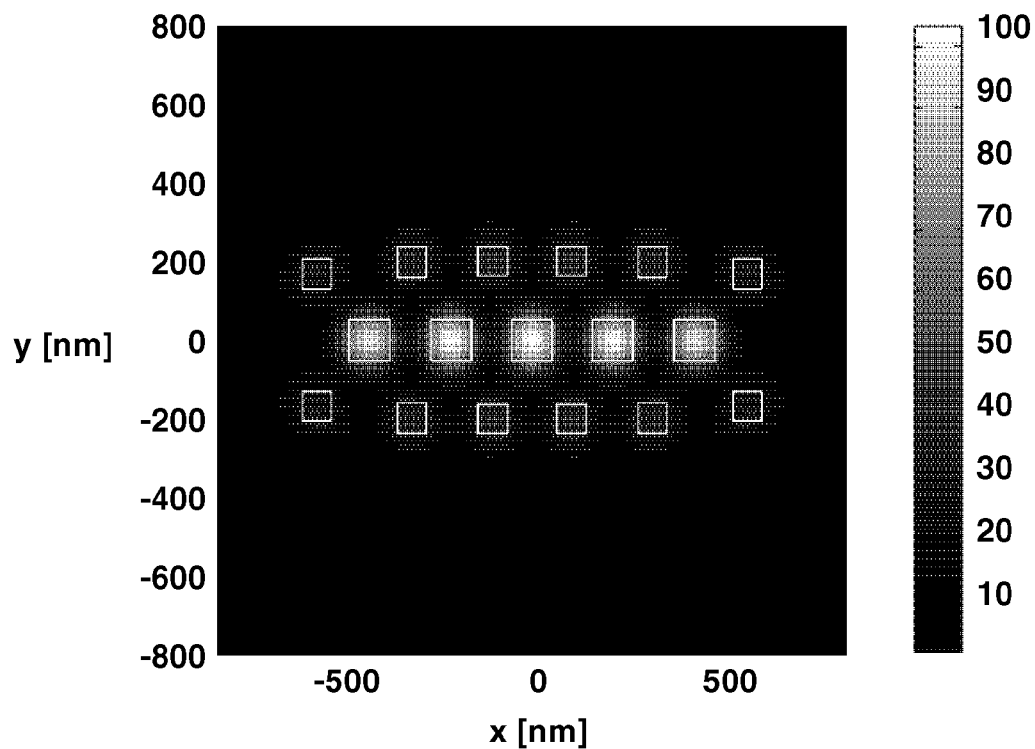
FIGS. 7A and 7B illustrate an aerial image simulation result according to the second exemplary embodiment of the present invention.
Figure 7B:
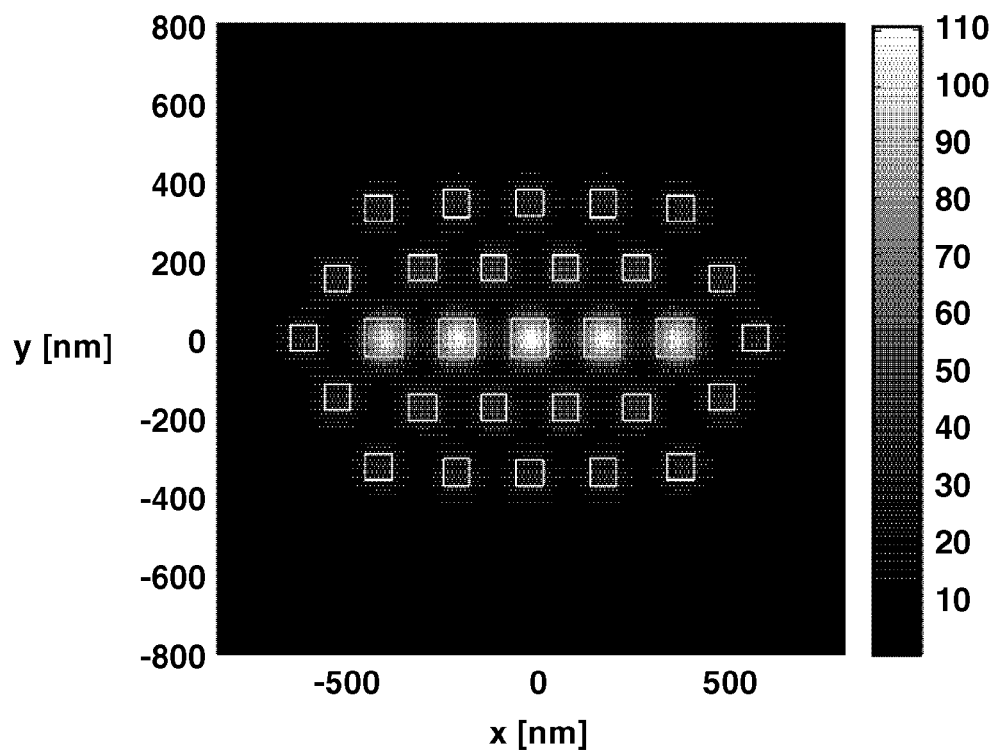

FIG. 7A illustrates a result of an aerial image simulation performed using the mask pattern illustrated in FIG. 6D. FIG. 7B illustrates a result of an aerial image simulation performed using the mask pattern illustrated in FIG. 6F.

Vertical and horizontal axes in FIGS. 7A and 7B indicate mutually orthogonal coordinate axes on the image plane. The degree of light and dark at each position indicates a light intensity value, as indicated with a numerical value in a right portion of FIGS. 7A and 7B. In the examples of FIGS. 7A and 7B, white-line squares correspond to primary patterns and auxiliary patterns illustrated in FIGS. 6D and 6F, which plainly indicate the patterns and the results of the calculation.

Figure 8:
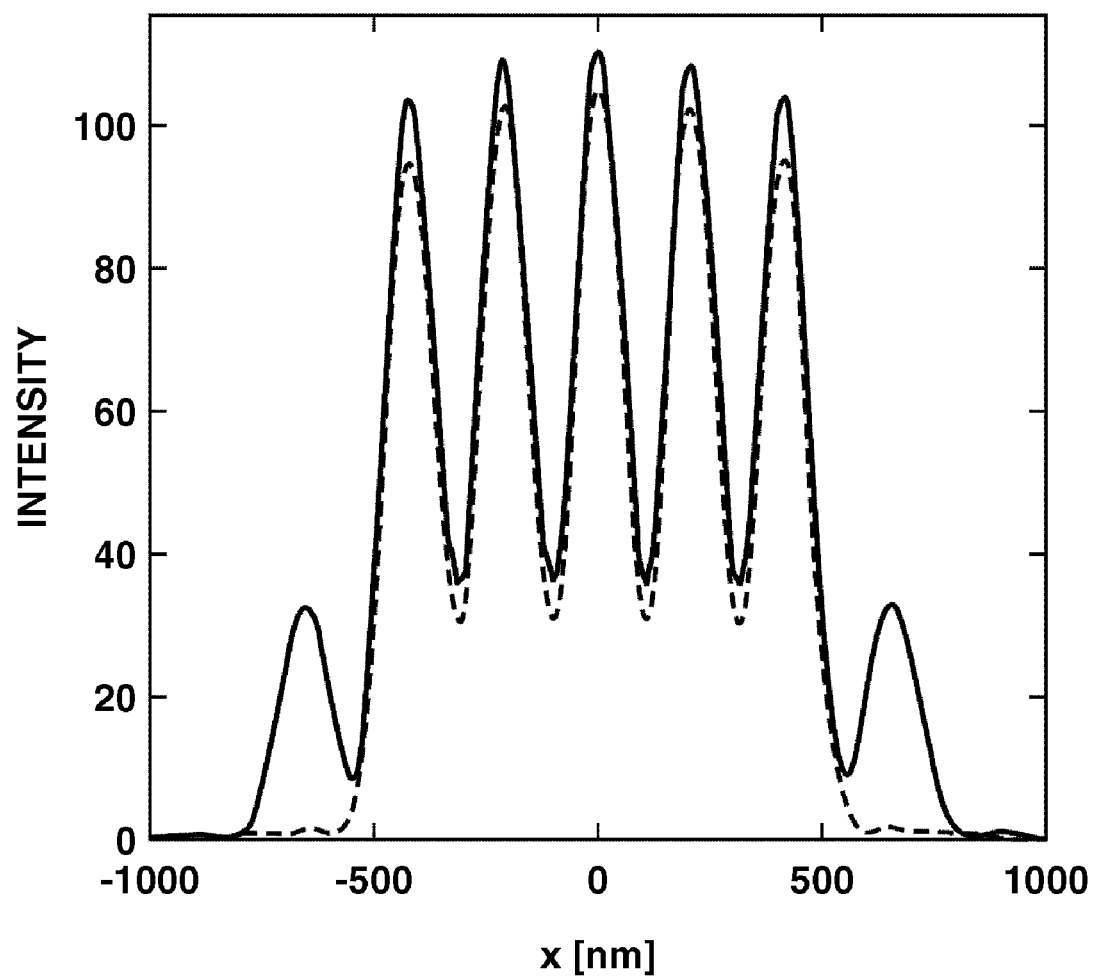
FIG. 8 illustrates a graph showing the result in FIG. 7A and 7B according to the second exemplary embodiment of the present invention.

FIG. 8 illustrates results of the calculation illustrated in FIGS. 7A and 7B in a graph according to the second exemplary embodiment of the present invention. In FIG. 8, a horizontal axis indicates a position x, a vertical axis indicates a light intensity obtained when y=0, a dotted line illustrates a result of the calculation illustrated in FIG. 7A, and a solid line illustrates a result of the calculation illustrated in FIG. 7B.

As can be seen from FIG. 8, a maximum intensity in the example in FIG. 7B is higher than the example of FIG. 7A. More specifically, the maximum intensity in the example in FIG. 7B is higher than the example of FIG. 7A by 6%. That is, the light intensity (light quantity) at the position at which a target pattern is formed becomes high.

As described above, the present exemplary embodiment can improve the throughput of the exposure apparatus by generating an original plate (mask) using the pattern data illustrated in FIG. 6F as the original plate data 40d, as in the first exemplary embodiment.

In the present exemplary embodiment, the original plate data 40d can be generated by performing the processing according to the flow chart of FIG. 2. In the present exemplary embodiment, the predetermined number n is set at 2.

A third exemplary embodiment of the present invention is described below. Now, a mask 130 generated by the processing according to the present exemplary embodiment and the exposure apparatus 100 to which the effective light source can be applied is described in detail with reference to FIG. 9.

Figure 9:
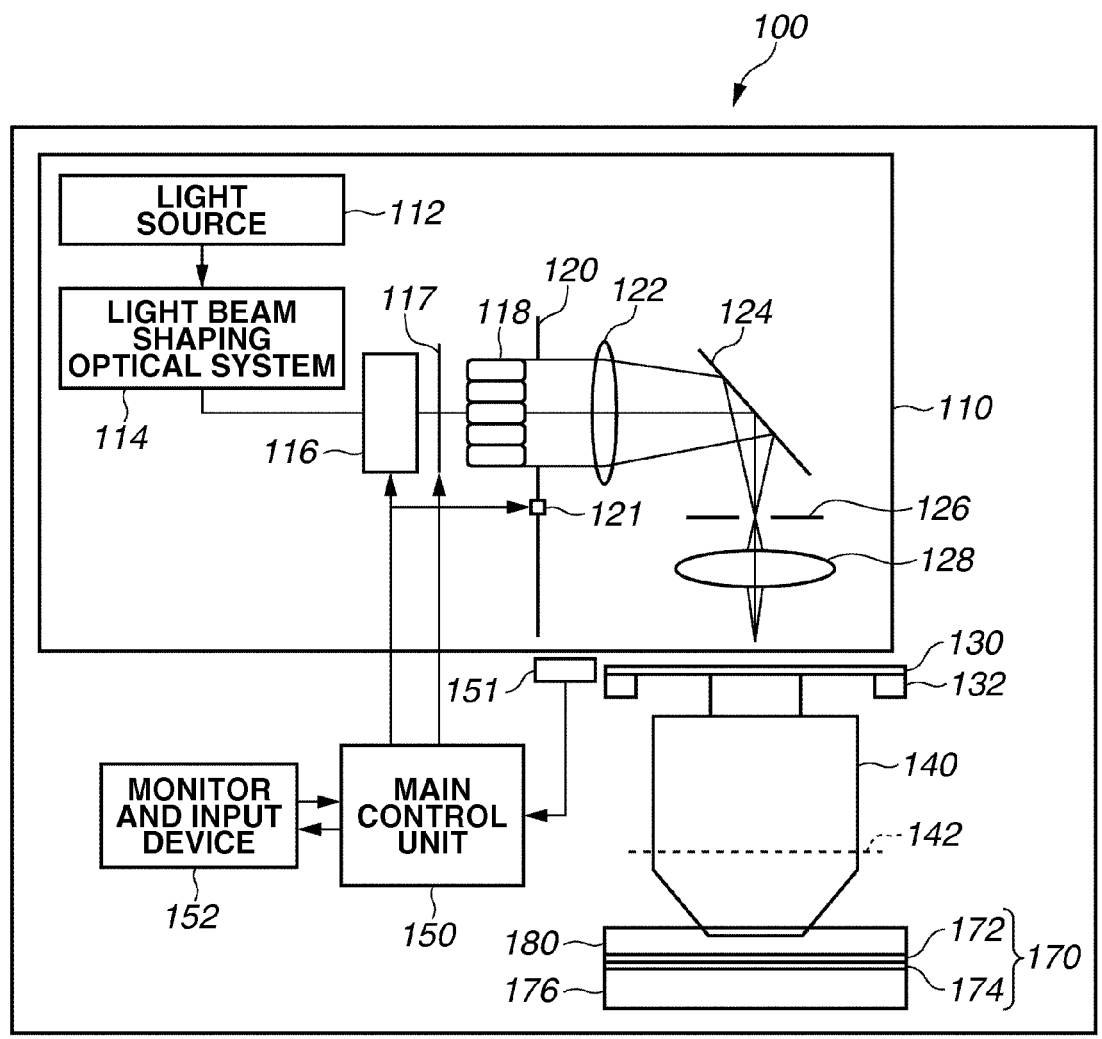
FIG. 9 illustrates an example of a hardware configuration of an exposure apparatus.

FIG. 9 illustrates an example of a configuration of the exposure apparatus 100.

Referring to FIG. 9, the exposure apparatus 100 includes the illumination device 110, a mask stage 132, the projection optical system 140, a main control unit 150, a monitor and input device 152, a substrate stage 176, and liquid 180 as a medium.

The exposure apparatus 100 is an immersion exposure apparatus that immerse a final surface of the projection optical system 140 and the substrate 170 in the liquid 180 and exposes the substrate 170 to the pattern of the mask 130 which is an original plate via the liquid 180. The exposure apparatus 100 is a step-and-scan type projection exposure apparatus. However, the present embodiment can also be applied to a step-and-repeat type projection exposure apparatus or other type exposure apparatuses.

The illumination device 110 illuminates the mask 130 on which a circuit pattern to be transferred is formed, and includes a light source unit and an illumination optical system. The light source unit includes a laser 112 as the light source and a beam shaping system 114.

As the beam shaping system 114, a beam expander having a plurality of cylindrical lenses, for example, can be used. The beam shaping system 114 converts an aspect ratio of a cross section of a parallel beam emitted from the laser 112 into a desired value to shape the beam into a desired one.

The beam shaping system 114 forms a light flux having a dimension and an angle of divergence necessary to illuminate an optical integrator 118. The optical integrator 118 will be described below.

The illumination optical system illuminates the mask 130. In the present exemplary embodiment, the illumination optical system includes a condenser optical system 116, a polarization control unit 117, the optical integrator 118, an aperture stop 120, a condenser lens 122, a folding mirror 124, a masking blade 126, and an imaging lens 128.

The illumination optical system can implement various illumination modes such as normal circular illumination, annular illumination, and multipolar illumination.

The condenser optical system 116 consists of a plurality of optical elements. The condenser optical system 116 can efficiently introduce a light flux having a desired shape into the optical integrator 118. The condenser optical system 116 includes a zoom lens system, for example, and controls the shape and the distribution of the angle of the beam incident on the optical integrator 118.

The condenser optical system 116 includes an exposure amount adjustment unit which can change the exposure amount of the illumination light on the mask 130 at every illumination operation. The exposure amount adjustment unit is controlled by the main control unit 150. An exposure amount monitor can be provided between the optical integrator 118 and the mask 130 or other appropriate position to measure the exposure amount and feed back a result of the measurement.

The polarization control unit 117 includes a polarization element, for example. The polarization control unit 117 is arranged at a position at which the polarization control unit 117 is substantially conjugated with a pupil 142 of the projection optical system 140. The polarization control unit 117 controls a state of polarization in a predetermined area of the effective light source formed in the pupil 142.

It is also useful if the polarization control unit 117 including a plurality of types of polarization elements is provided on a turret that can be rotated by an actuator (not illustrated) and the main control unit 150 controls the driving of the actuator.

The optical integrator 118 equalizes the illumination lights that illuminate the mask 130. The optical integrator 118 is configured as a fly-eye lens that converts an angular distribution of the incident light into a positional distribution and allows the light to exit therefrom. The fly-eye lens includes a combination of multiple rod lenses (minute lens elements), and a Fourier-transform relationship is maintained between a light incident surface and a light exit surface.

However, the optical integrator 118 is not limited to the fly-eye lens. Optical rods, diffraction gratings, and a plurality of pairs of cylindrical lens array boards arranged so that the pairs are orthogonal to one another are alternatives included within the scope of the optical integrator 118.

Immediately behind the light exit surface of the optical integrator 118, the aperture stop 120 having a fixed shape and diameter is provided. The aperture stop 120 is arranged at a position substantially conjugate with the pupil 142 of the projection optical system 140. The shape of the aperture of the aperture stop 120 is equivalent to an outer shape of the light intensity distribution (effective light source) of the pupil 142 of the projection optical system 140. The aperture stop 120 can determine the shape of the effective light source.

The aperture stop 120 can be exchanged by an aperture stop exchanging mechanism (actuator) 121 so that the aperture stop 120 is positioned within an optical path according to illumination conditions. The driving of the actuator 121 is controlled by a drive control unit 151 which is controlled by the main control unit 150. The aperture stop 120 can be integrated with the polarization control unit 117.

The condenser lens 122 condenses a plurality of light fluxes emitted from a secondary light source provided in the proximity of the light exit surface of the optical integrator 118 and transmitted through the aperture stop 120. Then, the light is reflected on the folding mirror 124. The condenser lens 122 evenly illuminates a surface of the masking blade 126 which is an illumination target surface by Kohler illumination.

The masking blade 126 consists of a plurality of movable light shielding boards. The masking blade 126 has a nearly rectangular arbitrary aperture shape equivalent to an effective area of the projection optical system 140. The light fluxes transmitted through the aperture of the masking blade 126 are used to illuminate the mask 130. The masking blade 126 is an aperture stop whose aperture width can be automatically varied to change the transfer area.

The imaging lens 128 irradiates the surface of the mask 130 with the light to transfer the aperture shape of the masking blade 126 to reduction-project the pattern on the mask 130 onto the substrate 170.

On the mask 130, a pattern to be transferred and an auxiliary pattern are formed. The mask 130 is supported and driven by the mask stage 132. The diffracted light is transmitted from the mask 130 through the projection optical system 140 and then is projected on the substrate 170. The mask 130 and the substrate 170 are arranged at a position that establishes an optically conjugate positional relationship.

The exposure apparatus 100, namely a scanner, transfers the pattern on the mask 130 to the substrate 170 by synchronous-scanning of the mask 130 and the substrate 170. In the case of a step-and-repeat type exposure apparatus, an exposure is performed in a state where the mask 130 and the substrate 170 are stationary.

As the mask 130, a binary mask, a halftone mask, or a phase shift mask can be used.

The mask stage 132 supports the mask 130 and moves the mask 130 in an X direction and a Y direction orthogonal to the X direction. The mask stage 132 is connected to a moving mechanism such as a linear motor. The exposure apparatus 100 scans the mask 130 and the substrate 170 in a synchronous state using the main control unit 150.

The projection optical system 140 has a function for forming on the substrate 170 an image of a diffracted light transmitted through the mask 130 to obtain the pattern formed thereon. As the projection optical system 140, an optical system including a plurality of lens elements or an optical system including a plurality of lens elements and at least one concave mirror (catadioptric optical system) can be used. In addition, an optical system having a plurality of lens elements and at least one diffractive optical element such as a kinoform can be used.

The main control unit 150 performs the driving and control of each unit and section. In particular, the main control unit 150 controls the illumination based on information input via an input unit of the monitoring and input device 152 and information from the illumination device 110. Control information of the main control unit 150 and other information is displayed on a monitor of the monitoring and input device 152.

On the substrate 170, a photoresist 172 is coated on a wafer 174. A liquid crystal substrate can be used instead of the wafer 174. The substrate 170 is supported by the substrate stage 176.

For the liquid 180, a material having a high transmissivity with respect to the exposure wavelength, with which no smear adheres to the projection optical system, and well matches the resist process is used.

The light flux emitted from the laser 112 during the exposure is introduced into the optical integrator 118 via the condenser optical system 116 after the beam is shaped by the beam shaping system 114.

The optical integrator 118 equalizes the illumination light and the aperture stop 120 sets the effective light source intensity distribution. The illumination light illuminates the mask 130 via the condenser lens 122, the folding mirror 124, the masking blade 126, and the imaging lens 128 under an optimum illumination condition. The light flux transmitted through the mask 130 is reduction-projected on the substrate 170 by the projection optical system 140 at a predetermined reduction ratio.

The final surface of the projection optical system 140 facing the substrate 170 is immersed in the liquid 180 having a high refractive index. Accordingly, the NA value of the projection optical system 140 becomes high and the resolution on the substrate 170 becomes high. Furthermore, by the polarization control, an image having high contrast is formed on the resist 172.

According to the present exemplary embodiment, the exposure apparatus 100 can provide a high-quality device (a semiconductor device, an liquid crystal display (LCD) device, an imaging device (charge-coupled device (CCD)), or a thin film magnetic head) by transferring the pattern on the resist with a high accuracy.

A method will be described for manufacturing a device (a semiconductor IC device or a LCD device) utilizing the exposure apparatus 100 to which the mask 130 generated according to the exemplary embodiments of the present invention is applied.

Firstly, a circuit of the device is designed. More specifically, based on a functional specification of the device, the device is designed at a schematic level. Then, the layout of the device is designed.

In designing a layout, the above-described layout pattern is worked out using computer aided design (CAD) software to generate the pattern data 40a.

Then, a mask suitable for forming the designed circuit pattern is prepared. More specifically, the original plate data 40d is generated with the method according to the exemplary embodiments of the present invention.

Then, the original plate data 40d is input to the EB lithography apparatus to draw the pattern of Cr on the mask 130 based on the original plate data 40d. Thus, the mask 130 is prepared.

Then, the exposure apparatus 100 performs processing for exposing the substrate (a wafer or a glass substrate) applied with a photosensitive material, processing for developing the substrate (photosensitive material), and other publicly known processing. Thus, the device is manufactured. The publicly known processes include etching, removing the resist, dicing, bonding, and packaging.

With the method for a manufacturing device according to the present exemplary embodiments, a device having a quality higher than a conventional device can be manufactured.

Furthermore, the present exemplary embodiments can generate data for a mask suitable for improving the throughput of the exposure apparatus. Thus, the time taken for manufacturing a semiconductor device can be reduced.

In the present exemplary embodiments, an exposure method using a binary mask is used. However, a similar original plate data generation method can be applied if a halftone mask is used. A halftone mask is a mask whose light shielding portion of a binary mask is a semi-translucent member and a 180 degrees phase difference is provided to the aperture of the mask.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-191939 filed Jul. 24, 2007, which is hereby incorporated by reference herein in its entirety.

What is claimed is:

1. A method for generating data for an original plate used during processing for illuminating the original plate with illumination light and projecting an image of a pattern on the original plate onto a substrate via a projection optical system, the method comprising steps of:

calculating a two-dimensional transmission cross coefficient based on a function indicating a distribution of an intensity of light formed on a pupil plane of the projection optical system with the illumination light and a pupil function for the projection optical system;

calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system;

generating a second pattern having the first pattern on the object plane and auxiliary patterns based on the approximate aerial image; and generating, by a control unit, original plate data including the second pattern generated by repeatedly performing the step of calculating an approximate aerial image and the step of generating a second pattern by using the second pattern generated as the first pattern on the object plane.

2. A computer-readable storage medium containing computer-executable instructions for generating data for an original plate used during processing for illuminating the original plate with illumination light and projecting an image of a pattern on the original plate onto a substrate via a projection optical system, the medium comprising:

computer-executable instructions for calculating a two-dimensional transmission cross coefficient based on a function indicating a distribution of an intensity of light formed on a pupil plane of the projection optical system with the illumination light and a pupil function for the projection optical system;

computer-executable instructions for calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system;

computer-executable instructions for generating a second pattern having the first pattern on the object plane and auxiliary patterns based on the approximate aerial image; and computer-executable instructions for generating, by a control unit, original plate data including the second pattern generated by repeatedly performing the computer executable instructions for calculating an approximate aerial image and the computer executable instructions for generating the second pattern by using the second pattern generated as the first pattern on the object plane.

3. A method for generating an original plate comprising:
generating data for the original plate by a computer;
wherein the step of generating data comprises steps of:
   calculating a two-dimensional transmission cross coefficient based on a function indicating a distribution of an intensity of light formed on a pupil plane of the projection optical system with the illumination light and a pupil function for the projection optical system;
   calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system;
   generating a second pattern having the first pattern on the object plane and auxiliary patterns based on the approximate aerial image; and
   generating, by a control unit, original plate data including the second pattern generated by repeatedly performing the step of calculating an approximate aerial image and the step of generating a second pattern by using the second pattern generated as the first pattern on the object plane.

4. A method of exposing a substrate comprising:
generating an original plate by,
generating data for the original plate by a computer;
illuminating the original plate by an exposure apparatus; and
projecting an image of a pattern on the original plate onto the substrate and exposing the substrate via a projection optical system by the exposure apparatus,
wherein the step of generating data comprises steps of:
   calculating a two-dimensional transmission cross coefficient based on a function indicating a distribution of an intensity of light formed on a pupil plane of the projection optical system with the illumination light and a pupil function for the projection optical system;
   calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system;
   generating a second pattern having the first pattern on the object plane and auxiliary patterns based on the approximate aerial image; and
   generating, by a control unit, original plate data including the second pattern generated by repeatedly performing the step of calculating an approximate aerial image and the step of generating a second pattern by using the second pattern generated as the first pattern on the object plane.

5. A method of manufacturing a device comprising:
generating data for an original plate by a computer;
illuminating the original plate by an exposure apparatus; and
projecting an image of a pattern on the original plate onto a substrate and exposing the substrate via a projection optical system by the exposure apparatus;
developing, by the exposure apparatus, the exposed substrate; and
manufacturing the device by processing, by the exposure apparatus, the developed substrate,
wherein the step of generating data comprises steps of:
   calculating a two-dimensional transmission cross coefficient based on a function indicating a distribution of an intensity of light formed on a pupil plane of the projection optical system with the illumination light and a pupil function for the projection optical system;
   calculating an approximate aerial image obtained by approximating an aerial image on an image plane of the projection optical system by at least one component of a plurality of components of the aerial image based on the calculated two-dimensional transmission cross coefficient and a first pattern on an object plane of the projection optical system;
   generating a second pattern having the first pattern on the object plane and auxiliary patterns based on the approximate aerial image; and
   generating, by a control unit, original plate data including the second pattern generated by repeatedly performing the step of calculating an approximate aerial image and the step of generating a second pattern by using the second pattern generated as the first pattern on the object plane.

* * * * *